US008727125B2

(12) United States Patent
Tieben et al.

(10) Patent No.: US 8,727,125 B2
(45) Date of Patent: May 20, 2014

(54) SUBSTRATE CONTAINER WITH FLUID-SEALING FLOW PASSAGEWAY

(75) Inventors: Anthony Mathius Tieben, Jordan, MN (US); John Lystad, Bloomington, MN (US); David L. Halbmaier, Shorewood, MN (US)

(73) Assignee: Entegris, Inc., Billerica, MA (US)

( * ) Notice: Subject to any disclaimer, the term of this patent is extended or adjusted under 35 U.S.C. 154(b) by 325 days.

(21) Appl. No.: 12/026,336

(22) Filed: Feb. 5, 2008

(65) Prior Publication Data
US 2008/0121560 A1  May 29, 2008

Related U.S. Application Data

(62) Division of application No. 11/108,619, filed on Apr. 17, 2005, now Pat. No. 7,328,727.

(60) Provisional application No. 60/563,528, filed on Apr. 18, 2004.

(51) Int. Cl.
B65B 31/04 (2006.01)
(52) U.S. Cl.
USPC ........ 206/711; 206/454; 206/832; 211/41.18; 414/217.1
(58) Field of Classification Search
USPC .......................... 206/711, 710, 454, 832, 833; 211/41.18; 220/371; 414/217.1
See application file for complete search history.

(56) References Cited

U.S. PATENT DOCUMENTS

| | | | |
|---|---|---|---|
| 4,666,479 A | 5/1987 | Shoji | |
| 4,668,484 A | 5/1987 | Elliott | |
| 4,724,874 A | 2/1988 | Parikh et al. | |
| 4,815,912 A | 3/1989 | Maney et al. | |
| 4,995,430 A | 2/1991 | Bonora et al. | |
| 5,137,063 A | 8/1992 | Foster et al. | |
| 5,217,053 A | 6/1993 | Foster et al. | |
| 5,255,783 A | 10/1993 | Goodman et al. | |
| 5,303,482 A | 4/1994 | Yamashita et al. | |
| 5,346,518 A | 9/1994 | Baseman et al. | |
| 5,363,276 A | 11/1994 | Crockett | |
| 5,482,161 A * | 1/1996 | Williams et al. | 206/711 |
| 5,518,115 A * | 5/1996 | Latulippe | 206/370 |
| 5,628,121 A | 5/1997 | Brooks et al. | |
| 5,788,082 A | 8/1998 | Nyseth | |
| 5,815,947 A | 10/1998 | Brooks et al. | |
| 5,873,468 A | 2/1999 | Ejima et al. | |
| 5,988,233 A | 11/1999 | Fosnight et al. | |
| 6,010,008 A | 1/2000 | Nyseth et al. | |
| 6,032,802 A | 3/2000 | Ejima et al. | |
| 6,042,651 A | 3/2000 | Roberson, Jr. et al. | |
| 6,056,026 A | 5/2000 | Fosnight et al. | |
| 6,105,781 A | 8/2000 | Ejima et al. | |

(Continued)

FOREIGN PATENT DOCUMENTS

| | | | |
|---|---|---|---|
| JP | 2001-500669 | 1/2001 | |
| WO | WO 98/11598 | 3/1998 | |
| WO | WO 2004025721 A1 * | 3/2004 | ............. H01L 21/68 |

*Primary Examiner* — J. Gregory Pickett
*Assistant Examiner* — Robert Poon
(74) *Attorney, Agent, or Firm* — Christensen Fonder P.A.

(57) ABSTRACT

A substrate container includes an enclosure and an access structure formed in the enclosure and providing fluid access through the enclosure to an interior of the substrate container. The access structure includes an opening and an inner surface. A grommet is situated against the inner surface of the access structure.

16 Claims, 9 Drawing Sheets

(56) References Cited

U.S. PATENT DOCUMENTS

| | | |
|---|---|---|
| 6,155,027 A | 12/2000 | Brooks |
| 6,164,664 A * | 12/2000 | Fosnight et al. ............... 277/635 |
| 6,187,182 B1 | 2/2001 | Reynolds et al. |
| 6,199,604 B1 | 3/2001 | Miyajima |
| 6,354,601 B1 | 3/2002 | Krampotich et al. |
| 6,428,729 B1 | 8/2002 | Bhatt et al. |
| 6,732,877 B2 * | 5/2004 | Wu et al. ........................ 220/300 |
| 6,880,598 B2 * | 4/2005 | Haunhorst et al. ............. 152/415 |
| 6,997,664 B1 * | 2/2006 | Liang et al. ................. 414/217.1 |
| 7,455,180 B2 * | 11/2008 | Sumi et al. ..................... 206/710 |
| 2003/0047562 A1 * | 3/2003 | Wu et al. ........................ 220/300 |
| 2005/0247594 A1 * | 11/2005 | Mimura et al. ................. 206/710 |

* cited by examiner

SUBSTRATE CONTAINER WITH FLUID-SEALING FLOW PASSAGEWAY

RELATED APPLICATION

This application is a divisional of application Ser. No. 11/108,619 filed Apr. 17, 2005, which claims the benefit of U.S. Provisional Application No. 60/563,528 filed Apr. 18, 2004, each of which is hereby fully incorporated herein by reference.

FIELD OF THE INVENTION

The invention relates to substrate containers. More particularly, the invention relates to substrate containers that include a flow passage for a fluid.

BACKGROUND OF THE INVENTION

In general, carriers are utilized for transporting and/or storing batches of silicon wafers or magnetic disks before, during and after processing of the disks or wafers. The wafers can be processed into integrated circuits and the disks can be processed into a magnetic storage disks for computers. The terms wafer, disk, or substrate are used interchangeably herein and any of these terms can refer to semiconductor wafers, magnetic discs, flat panel substrates, and other such substrates, unless otherwise indicated.

The processing of wafer disks into integrated circuit chips often involves multiple steps where the disks are processed at various processing stations, and stored and transported between processing steps. Due to the delicate nature of the disks and their susceptibility to contamination by particles or chemicals, it is vital that they are properly protected throughout this procedure. Wafer containers have been used to provide this necessary protection. Additionally, since the processing of disks is generally automated, it is necessary for disks to be precisely positioned relative to the processing equipment for the robotic removal and insertion of the wafers. A second purpose of a wafer container is to securely hold the wafer disks during transport. The terms wafer containers, carriers, cassettes, transport/storage bins, and the like, are used interchangeably herein unless otherwise indicated.

During processing of semiconductor wafers or magnetic disks, the presence of or generation of particulates presents very significant contamination problems. Contamination is accepted as the single largest cause of yield loss in the semiconductor industry. As the size of integrated circuitry has continued to be reduced, the size of particles which can contaminate an integrated circuit has also become smaller making minimization of contaminants all the more critical. Contaminants in the form of particles may be generated by abrasion such as the rubbing or scraping of the carrier with the wafers or disks, with the carrier covers or enclosures, with storage racks, with other carriers or with processing equipment. Additionally, particulates such as dust can be introduced into the enclosures through the openings or joints in the covers and/or enclosures. Thus, a critical function of wafer carriers is to protect the wafers therein from such contaminants.

Containers are generally configured to axially arrange the wafers or disks in slots, and to support the wafers or disks in slots, and to support the wafers or disks by or near their peripheral edges. The wafers or disks are conventionally removable from the containers in a radial direction upwardly or laterally. The containers may have a shell portion with a lower opening, a door to latch into the lower opening, and a discrete carrier that rests on the door. This configuration, known as SMIF pods, is illustrated in U.S. Pat. Nos. 4,995,430 and 4,815,912, both owned by the owner of the instant application and both incorporated herein by reference. Additionally, wafer carrier assemblies can have front openings with doors that latch onto front openings, which are known as FOUPs or FOSBs, and are described in, for example, U.S. Pat. Nos. 6,354,601, 5,788,082 and 6,010,008, all of which are incorporated by reference herein. In certain configurations, the bottom covers or doors, front doors or the container portions have been provided with openings or passageways to facilitate the introduction and/or exhaustion of gases such as nitrogen or other purified gasses, into the wafer carrier assemblies to displace ambient air that might have contaminants.

Previous containers have employed filter plugs to reduce the amount of particular contaminants that enter the container assemblies during purging. However, conventional attachment and sealing between the operation element, i.e. the filter, and the housing of the seal is by the way of rigid plastic housings and o-rings. Wafer containers known in the art have also utilized various connection or coupling mechanisms for fluidly interfacing the flow passageways of the wafer containers to fluid supply and pressure or vacuum sources. Such attachment and sealing requires specialized components which may be of complex configuration.

SUMMARY OF THE INVENTION

An improved wafer container according to one aspect of the invention includes a an enclosure portion with an open side or bottom, a door to sealingly close the open side or open bottom and defining an enclosure or container, and a plurality of wafer support shelve contained within the container. The door couples with the enclosure portion to form a continuous enclosure that isolates the wafer carrier or other substrate from the ambient atmosphere. The container has at least one access structure defining a flow conduit into and out of the enclosure. A sealing grommet is situated within the access structure in a fluid-tight engagement. An outer surface of the grommet establishes a generally fluid-tight seal against an inner surface of the flow conduit. In one embodiment, the grommet defines a flow passageway such as, for example, a cylindrical bore. In a related embodiment, the grommet includes a contact surface that can facilitate a fluid-tight coupling between the interior volume of the wafer container and a nozzle or nipple for a fluid or vacuum source. The grommet's interior sealing surface may define the flow passageway.

Optionally, the flow passageway through the grommet includes at least one operational element substantially or totally contained therein. The operational element can be any component, subassembly, or device that couples or interfaces the interior volume of the wafer container to the exterior. Examples of operational elements include valves, filters, sensors, plugs, or combinations thereof. The operational element is in fluid-tight engagement against the interior sealing surface.

In operation, according to one embodiment, the grommet maintains a seal against the access structure to prevent undesired chemicals or particulates from entering into the interior of the wafer container assembly. Thus, any flow of fluid between the interior and exterior of the wafer container is limited to passing through the passageway defined by the grommet. Types of fluid flows include the introduction of purging gases such as, for example, nitrogen into the interior of the wafer carrier assembly.

The fluid flow can be further limited by the operational element. For example, where the operational element is a particulate filter, gas passing through the passageway must also pass through the filter. In another example case where the operational element is a check valve, the fluid flow passing through the passageway is further limited to flowing in a specific direction. In one embodiment, the flow passageway through the grommet includes a filter and a check valve. In this embodiment, both functions, filtering, and flow direction assignment, are carried out. In the another example embodiment, the operational element is a removable plug, in which case no fluid is permitted to flow through the passageway when the plug is inserted.

In another example embodiment, the operational element includes a sensor. Types of useful sensors include temperature sensors, flow rate sensors, pressure sensors, gas concentration sensors, material detectors, and proximity sensors. Among these, and other sensors used as operational elements, some (such as flow sensors) may permit flow-through, while others (such as pressure sensors) function also as plugs.

In manufacturing, the use of uniform sizing of access structures, sealing grommets, and operational elements, permits modularization. Thus, for a product line of various wafer containers, each having specialized operational elements, the wafer container assembly housings can have a limited number of identical enclosure components with access structures positioned in a plurality of points throughout the common enclosures. Each access structure can have a sealing grommet, some of which are a blanking type (without a passageway), while other access structures can have sealing grommets with various integral operational elements. Sealing grommets can be pre-assembled with various operational elements and stocked as operational cartridge subassemblies.

An advantage and feature of preferred embodiments of the invention is that the grommet configuration provides an elastomeric element that is generally of a cylindrical configuration with a bore extending therethrough, the bore itself having a cylindrical configuration. The bore being of sufficient length to contain totally or substantially the entire length of an operational component inserted therein. The grommet preferably has at least one planar surface arranged to be normal to the axis of the grommet. Such surface can be utilized to effectively provide a seating surface for a nipple or nozzle as part of a purging system. Volumetrically, the grommet is preferably larger that the operational component container therein. The grommet preferably has a cross sectional area taken in an axial plane whereby the cross sectional area of the grommet is greater that the cross sectional area of the opening extending axially therethrough. The grommet preferably has a axial length that is greater than the diameter of the opening or bore extending axially through the grommet. Whereas an o-ring generally has a circular cross section, the grommet herein has a non circular cross-section and cylindrical inner facing surfaces, cylindrical outer facing surfaces, and planar end surfaces.

DETAILED DESCRIPTION OF THE PREFERRED EMBODIMENTS

Figure 1A:
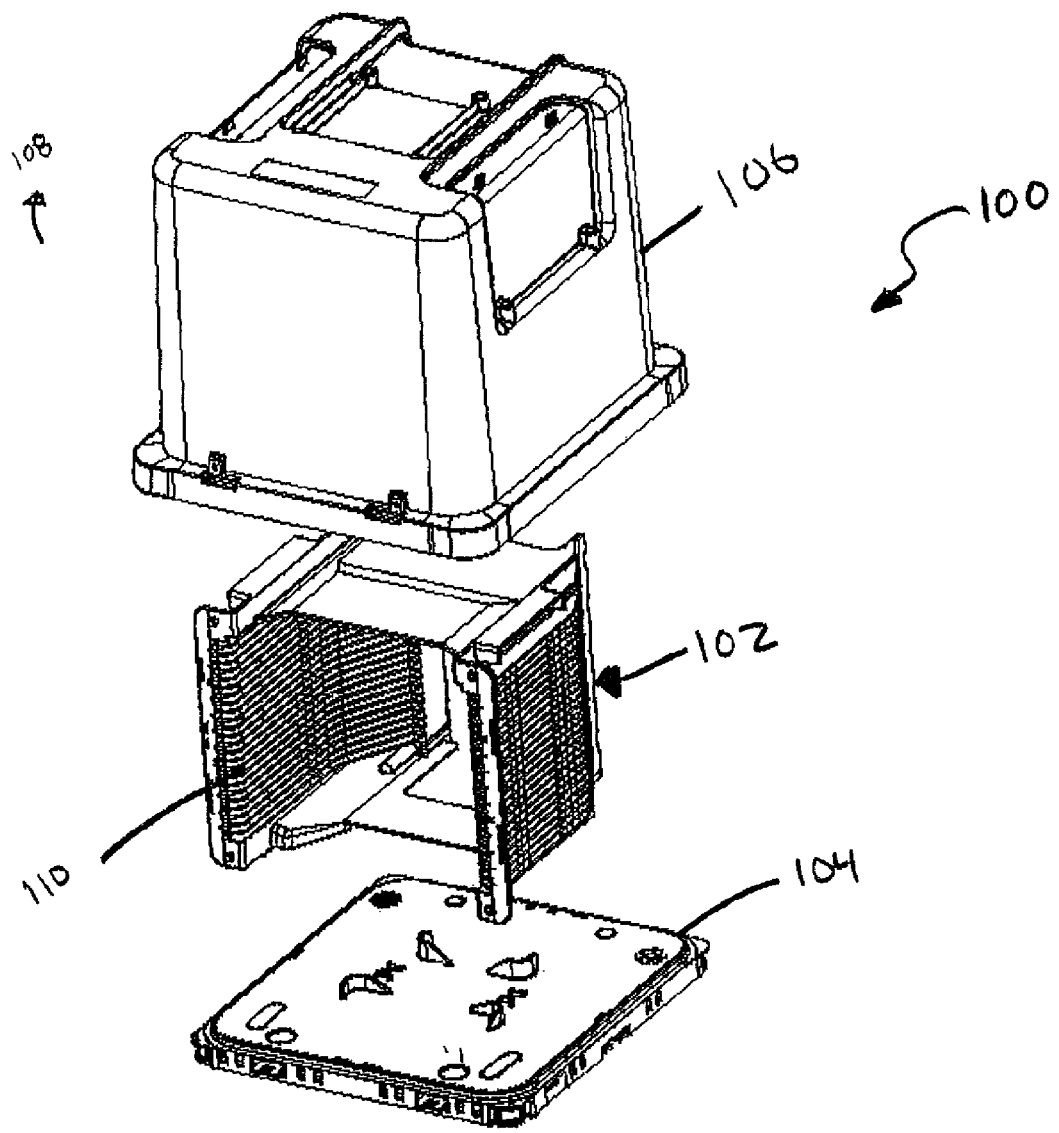
FIG. 1A is an exploded perspective view of a wafer container assembly comprising a wafer carrier, a bottom cover and an enclosure portion.
Figure 1B:
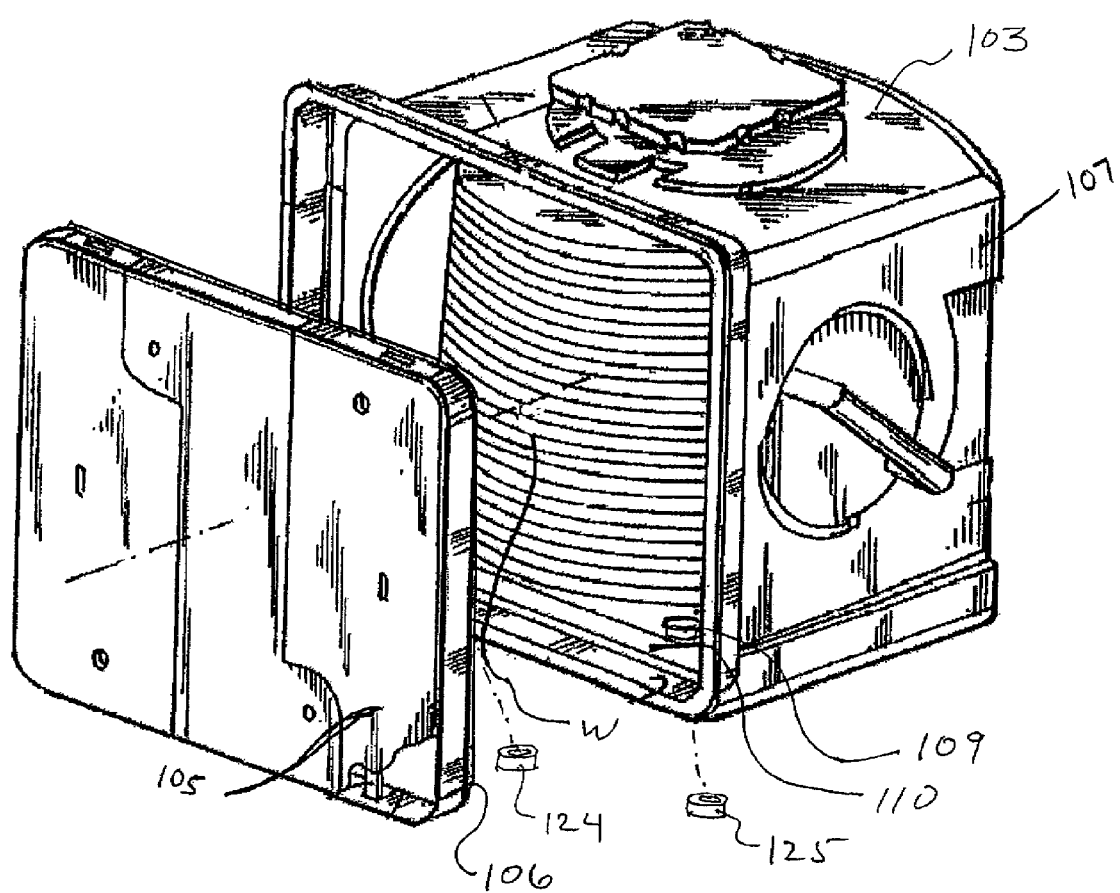
FIG. 1B is an exploded perspective view of another embodiment of a wafer container assembly comprising a wafer carrier, side cover and an enclosure portion.

FIG. 1A illustrates an example wafer container assembly 100 that includes wafer rack 102, bottom section 104 and enclosure portion 106. Bottom section 104 is adapted to sealably couple with enclosure portion 106 to define an interior space which can isolate wafer carrier 102 from ambient atmosphere 108. As shown in FIG. 1, wafer carrier 102 can comprise a plurality of elements 110 that can hold and position a plurality of silicon wafers within wafer carrier 102. Generally, elements 110 hold and position the silicon wafers such that contact between adjacent wafers is minimized, which can reduce damage to the wafers that can occur during processing and/or transportation of silicone wafers. FIG. 1B illustrates another configuration of a wafer container assembly 103 known as a FOUP or FOSB comprising an open front 104, a front door 105 and enclosure portion 107. Wafers W are removed horizontally through the open front. Slots formed in the interior sides hold the wafer. Front door 105 with seal sealingly engages with enclosure portions 107 to form an interior space that is isolated from the ambient atmosphere. The structure of a wafer carrier is described in, for example, U.S. Pat. No. 6,428,729 to Bhatt et al., entitled "Composite Substrate Carrier," which is hereby incorporated by reference herein. Additionally, wafer carrier assemblies having front openings with doors that latch onto front openings, known as FOUPs or FOSBs, are described in U.S. Pat. Nos. 6,354,601, 5,788,082, 6,010,008, all owned by the owner of the instant application and all hereby incorporated by reference herein. Receiving structure 109 for the grommets 124, 125 may be in the bottom wall of the enclosure portion.

Figure 2:
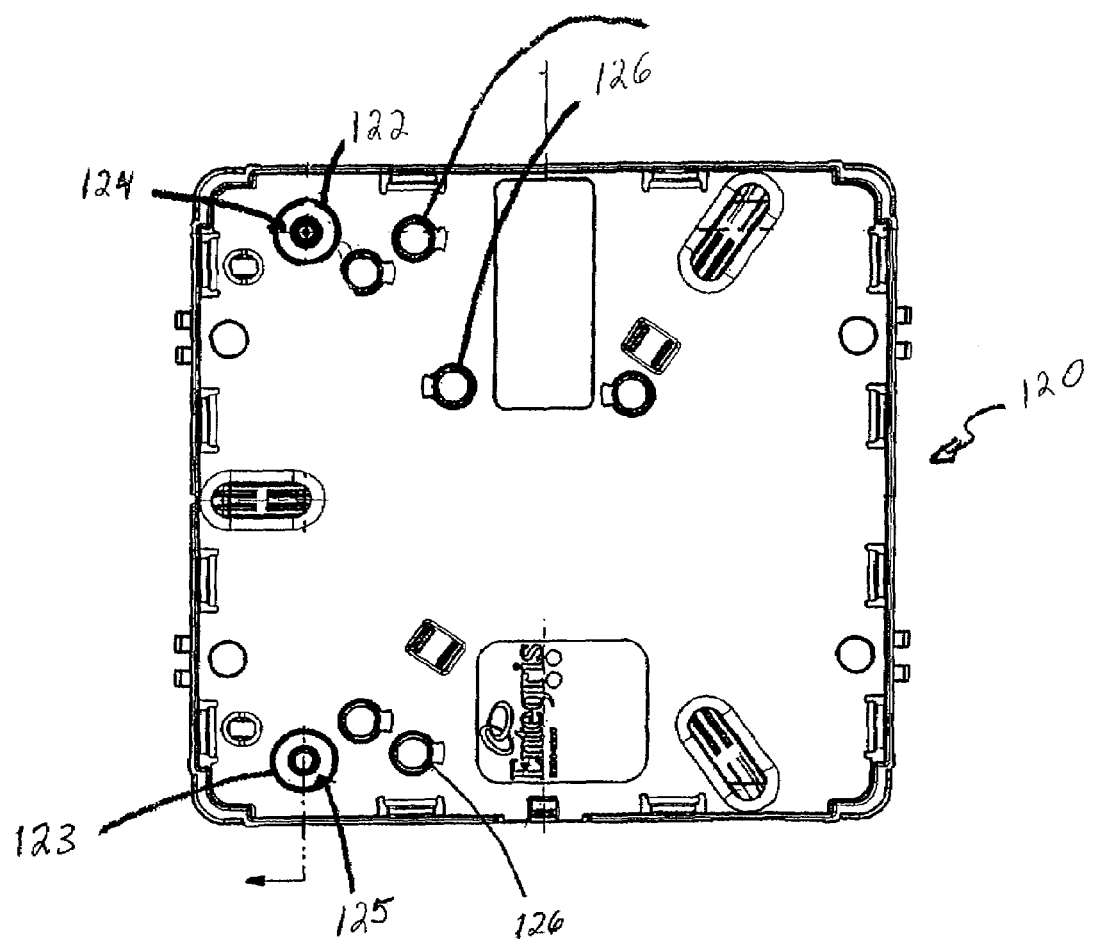
FIG. 2 is a bottom view of an example bottom cover showing structure located on the bottom surface of the bottom cover.

Referring to FIG. 2, an example wafer container section 120. In one type of embodiment, section 120 is a side cover, bottom cover, or door of a wafer container. In other type of embodiment, section 120 is a non-removable, non-openable wall section. Section 120 is illustrated comprising access structures in the form of openings 122, 123, grommets 124, 125 situated in openings 122, 123 and a plurality of status openings 126. Generally, the plurality of status openings 126 can be located at desired positions on cover section 120 to provide a structure for sensors, such as probes or other monitoring elements, to interface with the wafer container. For example, the interface between a sensor and a particular status opening 126 can provide information about the status of a wafer processing step or the like.

In one example embodiment, opening 122 facilitates fluid transfer into section 120, which can facilitate the introduction of gases and other fluids into the interior of the wafer container. Similarly, opening 123 provides fluid transfer out the wafer container through section 120 such that gas or fluid located within the wafer container can be vented to the ambient atmosphere. Thus, in this embodiment, opening 122 is an inlet, while opening 123 is an outlet. Although FIG. 2 illustrates an embodiment where section 120 comprises two openings 122, 123, embodiments having four, five, six, or more access structures located in section 120 are contemplated and are within the scope of the present disclosure.

As illustrated in FIG. 2, grommet 124 is positioned within opening 122 to seal opening 122, and grommet 125 is positioned within opening 123 to seal opening 123. As described below, grommets 124, 125 each creates a seal against the interior of their corresponding opening 122, 123, and provides at least one bore or passageway through the grommet. In one embodiment, the bodies of grommets 124, 125 each have a cross-sectional shape that corresponds with the interior features of openings 122, 123, and is sized to seal and substantially occlude its corresponding opening 152, 153. One of ordinary skill in the art will recognize that the cross-sectional shape and size of openings 122, 123 can be guided by size gas flow requirements, and operating pressures of a particular wafer container assembly. In a related embodiment (not shown), grommet 124 includes two distinct passageways.

Figure 3:
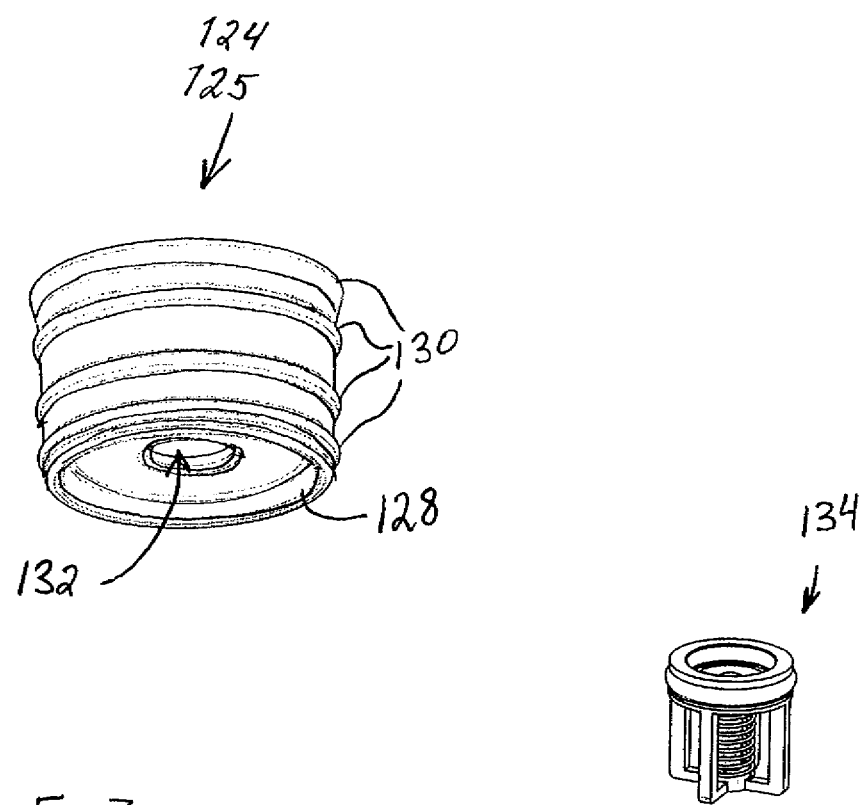
FIG. 3 is a diagram illustrating an example grommet and example operational element according to one embodiment of the present disclosure.

FIG. 3 illustrates one example embodiment of grommet 124, 125. Grommet 124, 125 according to this embodiment has a generally cylindrical body 128. In one type of embodiment, body 128 is formed from rubber, silicone, or other elastomer or polymer having desired sealing characteristics. Optionally, body 128 includes sealing features 130 in the form of ring-shaped protrusions circumferentially situated along the exterior of the cylindrical wall. Grommet 124, 125 also includes bore 132 passing through the center of body 128. The interior surface of body 128 that defines bore 132 optionally includes sealing features (not shown) for sealing against operational element 134 situated at least partially within bore 132.

In one example embodiment, operational element 132 is a valve such as a check valve. In another example embodiment, operational element 132 is a fluid filter. In another embodiment, operational element 132 is a sensor, such as a temperature sensor, flow rate sensor, pressure sensor, gas concentration sensor, material detector, or proximity sensor. In another embodiment, operational element 132 is simply a plug to prevent fluid travel through flow passageway 204.

Figure 4:
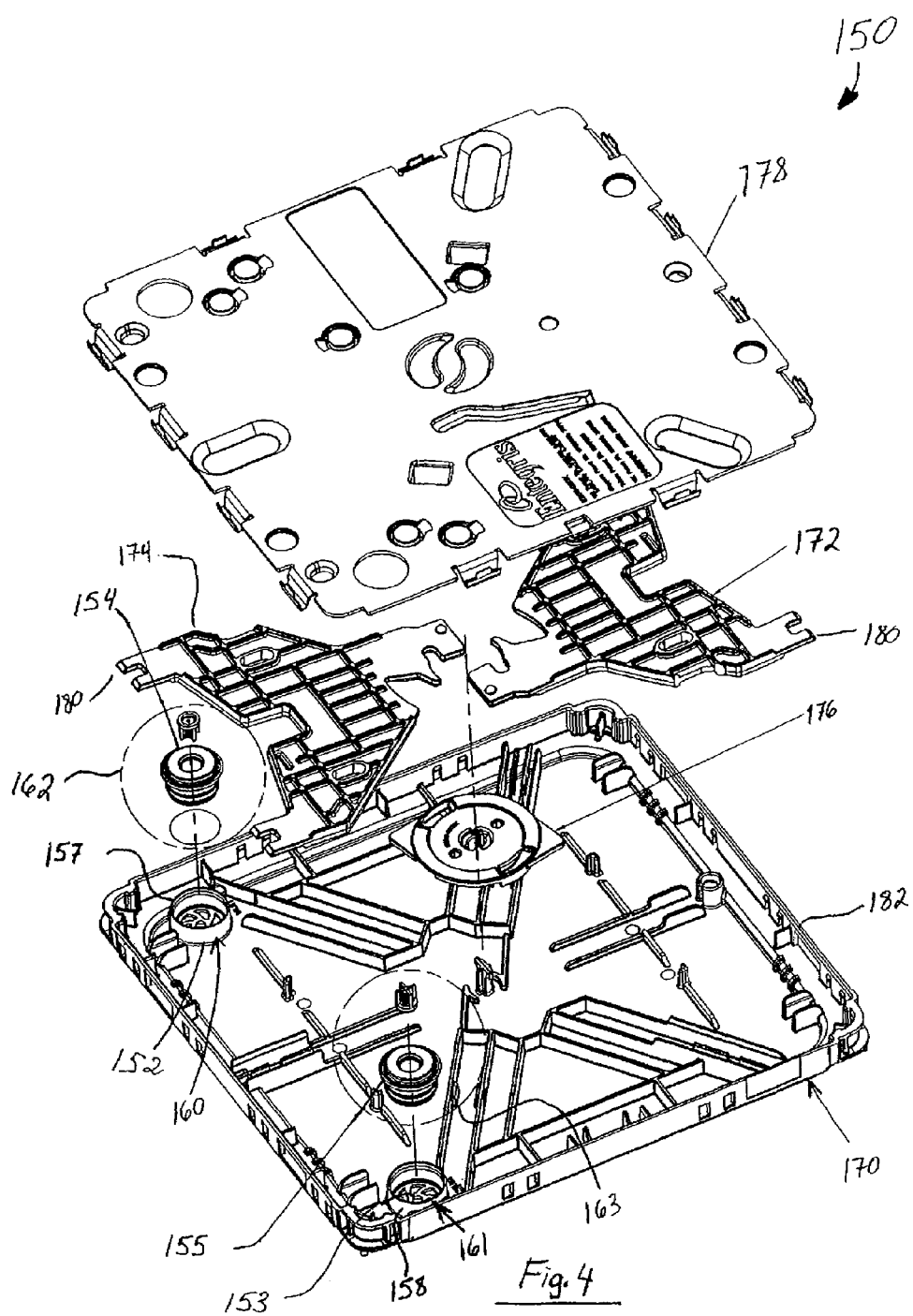
FIG. 4 is an exploded perspective view of an example cover or door for a wafer container assembly that includes sealing grommets and operational components.

FIG. 4 illustrates an example cover section 150. Cover section 150 includes cover enclosure 170, latch elements 172, 174, cam 176 and outer cover section 178. Cam 176 is connected to latch elements 172, 174 such that rotation of cam 176 actuates latches 172, 174, which causes protrusions 180 to extend through openings 182 located in housing 170 and lock housing 170 to another enclosure section (not shown). Outer cover 178 is assembled over latch elements 172, 174 and cam 176. Cover section 150 also includes access structures 160, 161. Access structure 160 includes inlet opening 152 and flow conduit 157. Access structure 161 includes outlet opening 153 and flow conduit 158. Flow conduits 157 and 158 each have a generally cylindrical wall having a height that extends through the thickness of cover section 150 from the exterior of the wafer container to the interior.

Figure 5A:
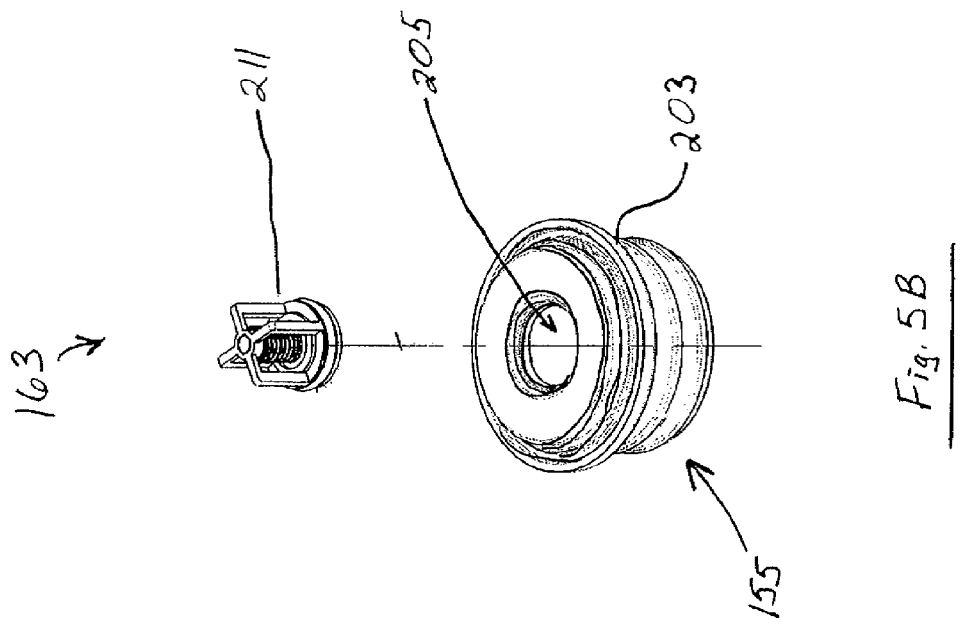
FIGS. 5A-5B illustrate the construction of example operational subassemblies, each incorporating a grommet and at least one operational element.
Figure 5B:
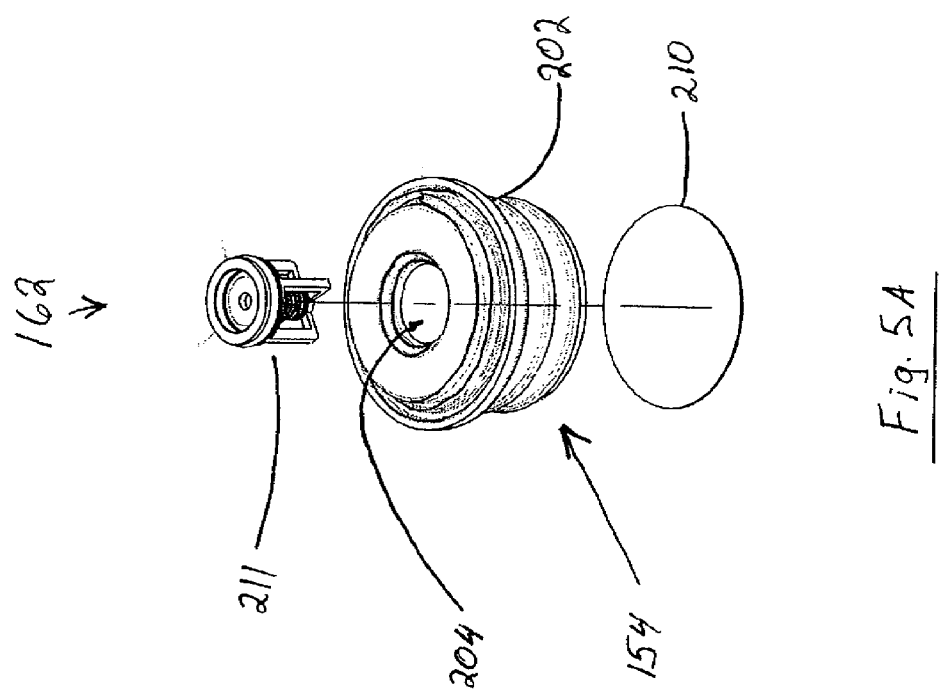

Flow conduits 157 and 158 retain operational subassemblies 162 and 163, respectively. FIGS. 5A and 5B illustrate operational subassemblies 162 and 163 in greater detail. Operational subassembly 162 is an inlet subassembly and includes grommet 154 having body 202 and bore 205. Operational subassembly 162 further includes check valve 211 installable into bore 204, and filter 210. Embodiments of filter 210 include particle filters of suitable technology, such as HEPA filtration, or the like. Operational subassembly 163 is an outlet subassembly that includes grommet 155 having body 203 and bore 205. Optionally, operational subassemblies 162, 163 are each pre-assembled with their respective constituent components as operational cartridges.

Figure 5C:
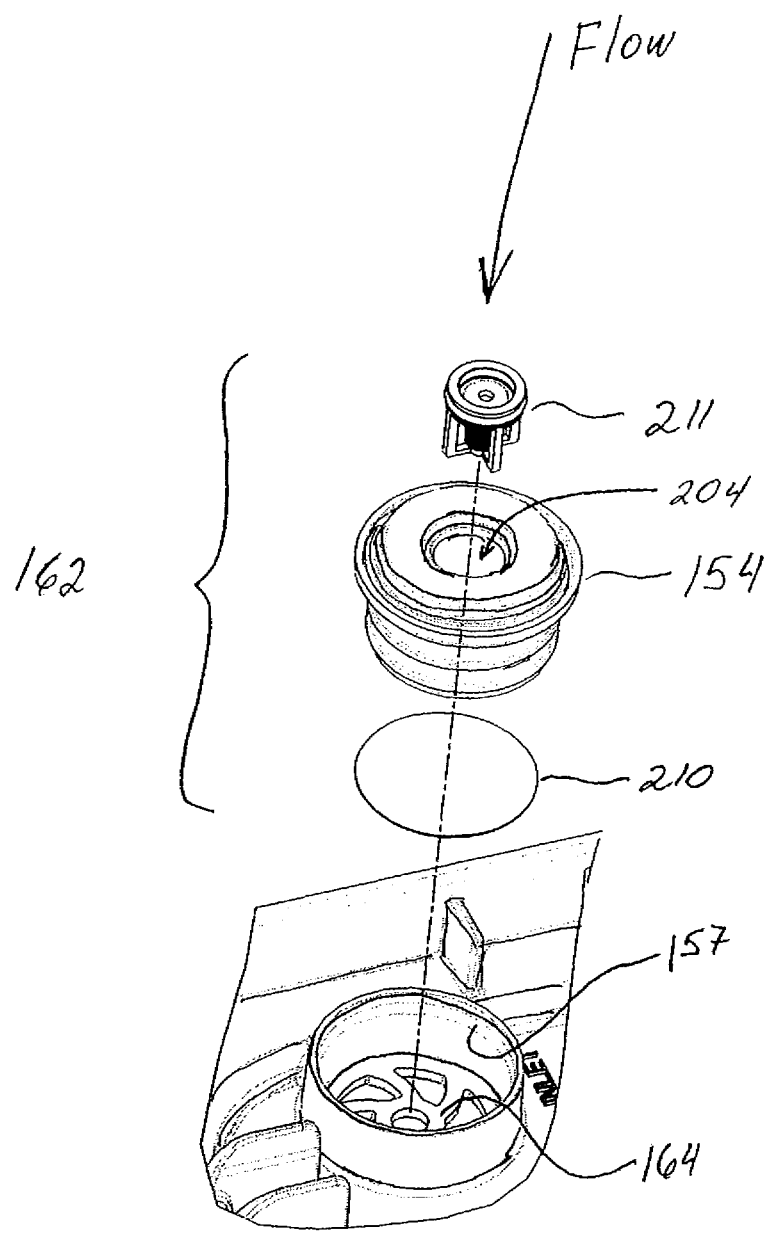
FIG. 5C illustrates an example assembly of an operational subassembly into a flow conduit.

FIG. 5C illustrates the assembly of operational subassembly 162 into flow conduit 157. Filter 210 is retained in place between the bottom of grommet 154 and retaining surface 164 of flow conduit 157. Grommet 154 fits within flow channel 157 and forms a seal with the interior wall of flow channel 157. Check valve 211 fits sealably within flow passageway 204 through grommet 154, and is aligned so that flow is permitted in the downward direction as indicated in FIG. 5C.

As described above, openings 152, 153 in cover section 150, or in any other enclosure portion, such as section 120 of a wafer container assembly, can be sealed by the grommets of the present disclosure. In one embodiment, the grommets include a body having a bore located within the housing, the bore extending along the major axis of the housing. Additionally, the embodiments of grommets of the present disclosure can comprise an operation element located with the bore. The operation element can comprise a check valve that can regulate the flow of gas or other fluids through the bore, a filter, a sensor or combinations thereof. The check valves employed in the present disclosure can be oriented within the bore such that the grommets can be used to seal both inlet and outlet openings on wafer carrier doors and/or enclosures. Additionally, as described below, the design of the grommet body can facilitate sealing of the opening without the need for a additional o-rings attached to the grommet. Furthermore, embodiments of grommets of the present disclosure can combine a grommet body, check value and/or filter into an integral cartridge, which can improve the overall sealing ability of the grommets and can facilitate easier construction of wafer carrier assemblies. In some embodiments, the grommets have an axial height from about ⅛ inch to about 1 inch, while in other embodiments the grommets can have an axial height from about ⅜ inch to about ¾ inch. Additionally, embodiments of grommets of the present disclosure can have a diameter from about ¼ inch to about 1.5 inches, while in other embodiments the grommets can have a diameter from about 12 inch to about ¾ inch. One of ordinary skill in the art will recognize that additional ranges of axial height and diameter of the grommets are contemplated and are within the scope of the present disclosure.

The grommets can be distinguished from O-rings known in the art in a number of ways. For example the grommet configuration provides an elastomeric element that is generally of a cylindrical configuration with a bore extending therethrough, the bore itself having a cylindrical configuration. The bore being of sufficient length to contain totally or substantially the entire length of an operational component inserted therein. The grommet preferably has at least one planar surface arranged to be normal to the axis of the grommet. Such surface can be utilized to effectively provide a seating surface for a nipple or nozzle as part of a purging system. Volumetrically, the grommet is preferably larger that the operational component container therein. The grommet preferably has a cross sectional area taken in an axial plane whereby the cross sectional area of the grommet is greater that the cross sectional area of the opening extending axially therethrough. The grommet preferably has a axial length that is greater than the diameter of the opening or bore extending axially through the grommet. Whereas an o-ring generally has a circular cross section, the grommet herein has a non circular cross-section and cylindrical inner facing surfaces, and cylindrical outer facing surfaces, and planar end surfaces.

Figure 6A:
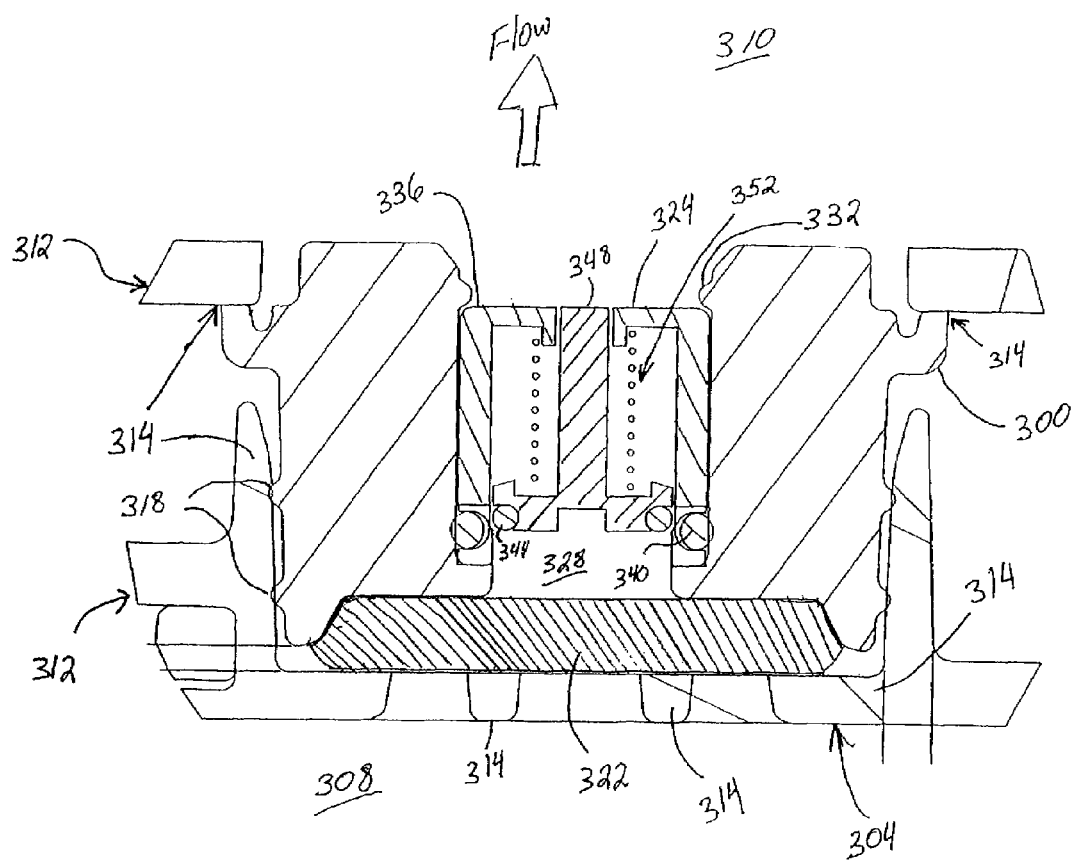
FIGS. 6A and 6B are cross-sectional views illustrating a gas purging arrangement according to one embodiment of the present disclosure.
Figure 6B:
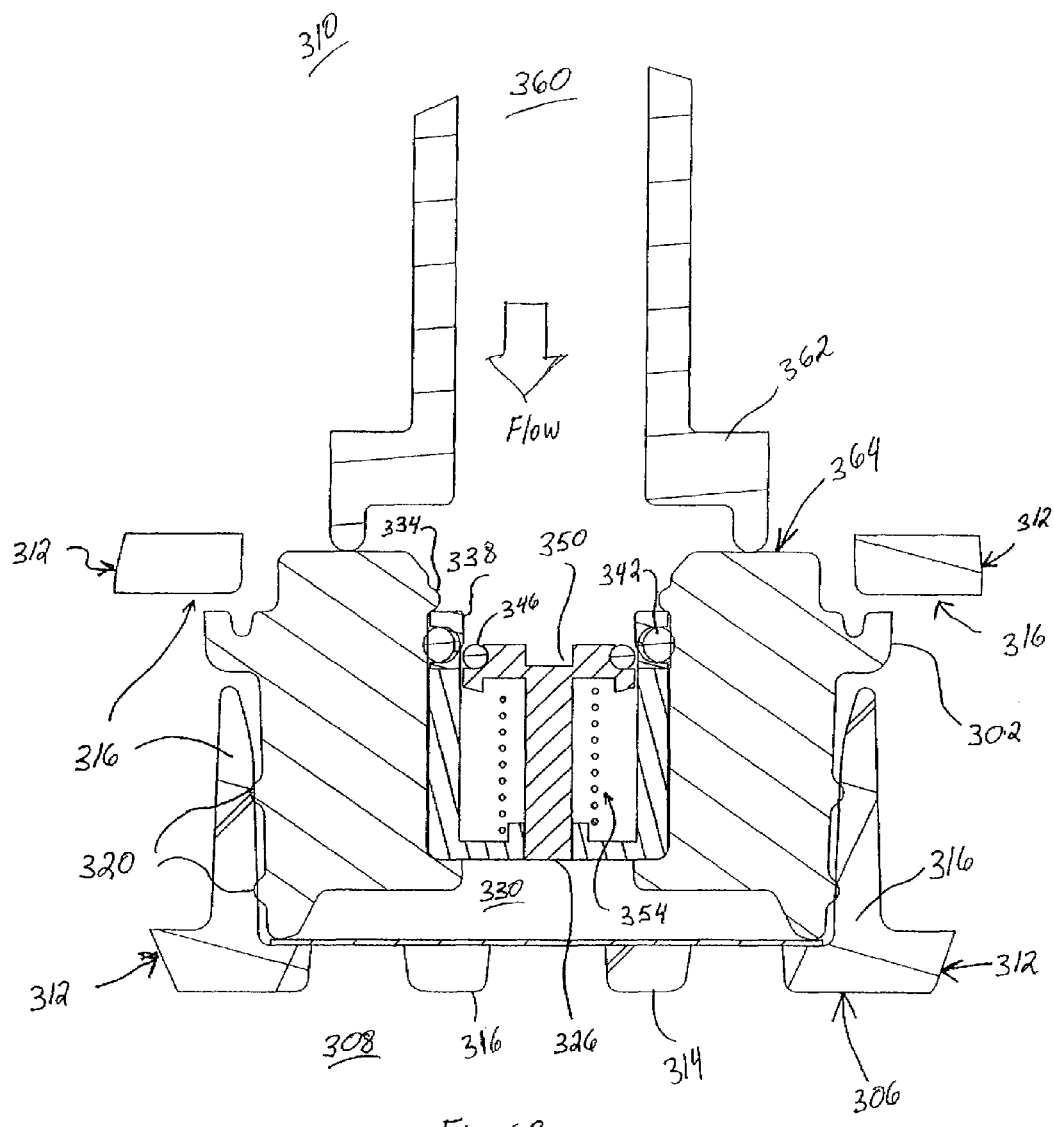

FIGS. 6A and 6B are cross-sectional views illustrating a gas purging arrangement according to one embodiment of the present disclosure. Example grommets 300 and 302 are situated in respective access structures 304 and 306 of an example wafer container having an interior 308 and exterior 310. Access structures 304, 306 are formed within a wall or door 312 of the wafer container, and each functions as a purging port. Access structure 304 includes a retaining structure 314 that has a geometry specially adapted to sealably engage grommet 300. Likewise, access structure 306 includes a retaining structure 316 that has a geometry adapted to engage with grommet 302. Grommets 300 and 302 each have various sealing features 318, 320 for creating fluid-tight contact with certain interior surfaces of retaining structures 314 and 316, respectively, as indicated.

FIG. 6A illustrates an inlet arrangement; whereas FIG. 6B illustrates an outlet arrangement. For each arrangement, the direction of the flow is indicated. The inlet arrangement of FIG. 6A also includes filter 322 situated and fluidly sealed between the contacting surfaces of grommet 300 and retaining structure 314. The inlet arrangement of FIG. 6A also includes a one-way valve assembly 324 positioned to permit fluid travel only in the indicated flow direction. Analogously, the outlet arrangement of FIG. 6B includes a one-way valve assembly 326 positioned to permit fluid travel only in the flow direction indicated. Valve assemblies 324, 326 are fluidly sealed within respective flow passageways 328, 330 defined by the bores of grommets 300, 302. Grommets 300, 302 have retaining features 332, 334 for securely holding valve assemblies 324, 326 in place within respective flow passageways 328, 330. In one type of embodiment, one-way valves 324, 326 comprise valve bodies 336 and 338, outer seal rings 340 and 342, inner seal rings 344 and 346, moveable pistons 348 and 350, and biasing springs 352 and 354.

In operation, the inlet and outlet arrangements can function in concert during a purging activity in which existing air or gas within the interior 308 of the wafer container is displaced by newly introduced air, gas, or other fluid. In one embodiment, as illustrated in FIG. 6B a vacuum source 360 is coupled to the interior volume 308 by a outlet nozzle 362. Outlet nozzle is adapted to interface with a contact surface 364 of grommet 302. When downward force is exerted by the outlet nozzle into grommet 302, grommet 302 compresses, but maintains its seal against the sealing inner surfaces of retaining structure 316 and against the outer surface of valve assembly 326. In one embodiment, the seals between grommet 302 and retaining structure 316 and valve assembly 326 are actually improved or made more effective by the downward force applied onto grommet 302 by outlet nozzle 362.

As the vacuum 360 is coupled with the interior volume 308, existing fluid in volume 308 is drawn out of the wafer container through the outlet of FIG. 6B, while replacement fluid is drawn in through the inlet of FIG. 6A, including through filter 322. In a related embodiment (not shown), a replacement fluid source (not shown) is coupled with interior volume 308 via an inlet nozzle having similar geometry with outlet nozzle 362 and coupled with inlet grommet 300 in the same manner in which outlet nozzle 362 is coupled with outlet grommet 302. In another embodiment (not shown), no outlet nozzle is coupled with grommet 302, and the inlet nozzle carries pressurized replacement fluid into the interior volume 308. In this embodiment, the displaced fluid simply exists through the outlet arrangement of FIG. 6B Generally, grommets 300, 302 can have the same cross-section shape as the opening in which the grommet is designed to seal. For example, in one embodiment, grommets 300, 302 have a generally cylindrical shape with a generally circular cross-section. However, one of ordinary skill in the art will recognize a variety of grommet body geometries are within the spirit of the present disclosure.

In one embodiment, grommets 300 and 302 are identical parts. In a related embodiment, valve assemblies 324 and 326 are identical parts. Thus, in one type of embodiment, the components of the present disclosure can be used to seal both inlet and outlet openings using the same component elements.

In another embodiment, grommets of the present disclosure can further include additional retaining features (not shown) for securely holding a filter such as filter 322 in the same or similar manner in which retaining features 332, 334 retain valve assemblies 324, 326. Thus, a pre-assembled operational subassembly can incorporate a grommet, a valve and a filter into a integral subassembly.

The grommet body, flanges and other components of the grommets of the present disclosure can be composed of any material suitable for use in semi-conductor processing applications including polymers and elastomers. In some embodiments, the grommet body and flanges can be composed of a fluoroelastomer. Examples of fluoroelastomers are sold under the trade name Viton® by Dupont Dow Elastomers. Additionally, in some embodiments, the elastomeric grommet body or grommet can have a fluoropolymer, or other inert polymer, coated onto to the surface of the grommet to isolate the elastomeric substance from the interior of the substrate container. Generally, the polymer or fluoropolymer coating should have some flexibility such that the sealing characteristics of the elastomeric grommet body are maintained.

The embodiments above are intended to be illustrative and not limiting. Additional embodiments are within the claims. Although the present invention has been described with reference to particular embodiments, workers skilled in the art will recognize that changes may be made in form and substance without departing from the spirit and scope of the invention.

What is claimed is:

1. A substrate container, comprising a container portion with an open side or bottom, a door to sealingly close the open side or bottom, one of the door and the container portion comprising a first access structure; and a first elastomeric grommet formed of elastomeric material, the grommet having an axis, the grommet retained in the access structure for providing fluid access to an interior of the substrate container, wherein the access structure defines an opening passing from interior the container to exterior the container, and wherein the access structure has an apertured wall extending transverse to the axis of the grommet and the access structure further has an axially extending wall with an inwardly facing surface sealingly engaged with the elastomeric material of the grommet therein, and wherein the first elastomeric grommet having generally a cylindrical shape or a tapered cylindrical shape, an axial length, an outer facing surface engaged with the inwardly facing surface of the axially extending wall of the access structure, an inwardly facing surface defining an opening configured as a bore extending axially through the grommet, and a pair of parallel and planar end faces arranged perpendicular to the axis, the grommet when viewed in cross-section taken axially coincident with the axis, having a cross-sectional area of the grommet that is greater than the cross-sectional area of the bore extending axially through the grommet, each of the pair of end faces formed of elastomeric material and one of the pair of end faces exteriorly exposed with respect to the substrate container for engaging with a purging nozzle, the substrate container further comprising a check valve positioned in the bore of the grommet and a filter positioned intermediate the grommet and the apertured wall; and whereby the grommet provides a single body with a continuous surface including an elastomeric sealing surface for sealing with the access structure, an elastomeric surface for sealing with the check valve in the bore, and an exposed elastomeric surface for sealing with an exterior purging nozzle.

2. The substrate container of claim 1, further comprising a second access structure formed in the enclosure and a second elastomeric grommet, the grommet having an axis, retained therein for providing fluid access through the enclosure between exterior and interior of the substrate container, wherein the second access structure defines an opening passing from interior the container to exterior the container, and wherein the access structure further has an axially extending wall with an inwardly facing surface for engaging a grommet therein and an apertured wall extending transverse to the axis of the second elastomeric grommet, and further the second elastomeric grommet having a shape corresponding to the first elastomeric grommet and having an outer facing surface confronting the inwardly facing surface of the second access structure with a filter positioned therebetween.

3. The substrate container of claim 1, wherein the grommet has outer radii measured radially between the axis and the outer facing surface, said outer radii measured for the entire axial length of the grommet and for each outer radius the grommet has a radial thickness measured between the inwardly facing surface of the grommet and the outer facing surface of the grommet, and for at least most of the axial length of the grommet, each radial thickness comprises most of the respective outer radii.

4. The substrate container of claim 1, wherein one end face of the grommet is an exteriorly exposed planar end face and the other end face is an interiorly positioned opposite planar end face and the operational element is a check valve and is positioned entirely between the respective end faces.

5. The substrate container of claim 1, wherein the opening configured as a bore has a cylindrical shape and extends from one end face of the grommet to the other end face.

6. The substrate container of claim 5, wherein the axial length of the grommet is greater than the diameter of the opening configured as a bore.

7. The substrate container of claim 1 wherein the filter is constrained in place by said grommet.

8. The substrate container of claim 1, wherein one of the end faces of the grommet is an exteriorly exposed planar end face providing a sealing surface for a nozzle or nipple as part of a purging system without using o-rings.

9. The substrate container of claim 1, wherein the grommet includes an exteriorly exposed contact surface that can facilitate a fluid-tight coupling between the interior volume of the substrate container and an external purging system.

10. The substrate container of claim 1, wherein the grommet includes a body having at least one feature facilitating sealing with an external purging member.

11. A substrate container, comprising:
a purging port having a generally cylindrical or tapered cylindrical wall surrounding an opening and an apertured wall;
an elastomeric grommet comprising elastomeric material, the grommet having a generally cylindrical outer surface or tapered cylindrical outer surface and opposite planar end faces, one of the two end faces providing elastomeric material outwardly exposed with respect to the substrate container thereby providing a purging nozzle engagement surface, the grommet sealingly situated within the purging port with the elastomeric material sealingly engaged with the cylindrical or tapered cylindrical wall, the elastomeric grommet including a bore extending from interior the substrate container to exterior of the substrate container providing a fluid flow path therethrough, the bore having a bore surface with exposed elastomeric material; and
an operational component sealingly situated substantially within the bore, the operational component comprising a one way check valve, the operational component sealingly engaged with the elastomeric material in the bore of the grommet; and
a filter positioner between the grommet and the apertured wall;
whereby the grommet provides a single body with a continuous surface including an elastomeric sealing surface for sealing with the access structure, an elastomeric surface for sealing with the check valve in the bore, and an exposed elastomeric surface for sealing with an exterior purging nozzle.

12. A substrate container, comprising:
an enclosure portion; and
a cover portion adapted to establish a fluid-tight engagement with the enclosure portion and define an interior volume;
wherein at least one of the cover portion and the enclosure portion has at least one access structure including at least one of a fluid inlet, a fluid outlet, and a fluid vent;
wherein the at least one access structure retains a grommet formed of elastomeric material in sealing communication therewith by way of engagement of the elastomeric material with the access structure; wherein the grommet includes a fluid passageway with a bore surface of elastomeric material that retains a check valve in sealing communication with the elastomeric material of the bore surface; and
wherein the grommet has a generally cylindrical shape with the fluid passageway configured as a cylindrical bore extending axially and a pair of opposite planar end surfaces, the cylindrical bore having an axial length that is greater than the length of the valve such that the valve is disposed completely within the cylindrical bore, wherein the opposite planar end faces are comprised of the elastomeric material, and wherein one of the opposite planar end faces is exteriorly exposed with respect to the substrate container thereby providing a purge nozzle engagement surface and the other of the opposite planar end faces confronts an apertured wall of the access structure with a filter positioned between the apertured wall and the other of the opposite planar end faces,
whereby the grommet provides a single body with a continuous surface including an elastomeric sealing surface for sealing with the access structure, an elastomeric surface for sealing with the check valve in the bore, and an exposed elastomeric surface for sealing with an exterior purging nozzle.

13. The substrate container of claim 12, wherein the cover portion has a plurality of access structures each with a respective grommet as described in claim 12.

14. The substrate container of claim 12, wherein the at least one access structure includes a flow conduit having an inner surface against which the grommet is in sealing communication.

15. The substrate container of claim 12, wherein the grommet is adapted to facilitate a sealing engagement between a vacuum/fluid source and the interior volume of the substrate container.

16. The substrate container of claim 12, wherein one of the planar end surfaces of the grommet is an exteriorly exposed surface that provides a sealing surface for a nozzle or nipple as part of a purging system without using o-rings.

\* \* \* \* \*